(12) United States Patent
Pass (10) Patent No.: US 9,735,308 B2
(45) Date of Patent: Aug. 15, 2017

(54) FOIL-BASED METALLIZATION OF SOLAR CELLS USING REMOVABLE PROTECTION LAYER

(71) Applicant: Thomas P. Pass, San Jose, CA (US)

(72) Inventor: Thomas P. Pass, San Jose, CA (US)

(73) Assignee: SunPower Corporation, San Jose, CA (US)

( * ) Notice: Subject to any disclaimer, the term of this patent is extended or adjusted under 35 U.S.C. 154(b) by 0 days.

(21) Appl. No.: 14/855,600

(22) Filed: Sep. 16, 2015

(65) Prior Publication Data

US 2016/0087119 A1    Mar. 24, 2016

Related U.S. Application Data

(60) Provisional application No. 62/052,372, filed on Sep. 18, 2014.

(51) Int. Cl.
| | | |
|---|---|---|
| *H01L 31/0224* | (2006.01) | |
| *H01L 31/18* | (2006.01) | |
| *H01L 31/0216* | (2014.01) | |
| *H01L 31/05* | (2014.01) | |

(52) U.S. Cl.
CPC ...... *H01L 31/18* (2013.01); *H01L 31/022441* (2013.01); *H01L 31/0516* (2013.01); *H01L 31/02167* (2013.01); *H01L 31/05* (2013.01); *Y02E 10/50* (2013.01); *Y02P 70/521* (2015.11)

(58) Field of Classification Search
CPC ......... H01L 31/0224; H01L 31/022425; H01L 31/022433; H01L 31/022441; H01L 31/02245; H01L 31/18; H01L 31/0203; H01L 31/0516; H01L 31/05; H01L 31/02167; H01L 31/02168; H01L 31/0504; H01L 31/0508; Y02E 10/50; Y02P 70/521

See application file for complete search history.

(56) References Cited

U.S. PATENT DOCUMENTS

| | | | |
|---|---|---|---|
| 2008/0216887 A1 | 9/2008 | Hacke et al. | |
| 2012/0103408 A1* | 5/2012 | Moslehi | H01L 31/02244 136/256 |
| 2012/0204938 A1 | 8/2012 | Hacke et al. | |
| 2015/0004737 A1* | 1/2015 | Harley | H01L 31/048 438/64 |
| 2015/0171230 A1* | 6/2015 | Kapur | H01L 31/02244 438/72 |

* cited by examiner

*Primary Examiner* — Thanh T Nguyen
(74) *Attorney, Agent, or Firm* — Blakely Sokoloff Taylor & Zafman LLP (57) ABSTRACT

Approaches for foil-based metallization of solar cells are described. For example, a method of fabricating a solar cell involves placing a metal foil over a metalized surface of a wafer of the solar cell. The method further involves placing a protection layer over the metal foil. The method further involves locating the metal foil with the metalized surface of the wafer. The protection layer preserves an optically consistent surface of the metal foil during the locating. The method also involves, subsequent to the locating, electrically contacting the metal foil to the metalized surface of the wafer.

20 Claims, 12 Drawing Sheets

FOIL-BASED METALLIZATION OF SOLAR CELLS USING REMOVABLE PROTECTION LAYER

CROSS-REFERENCE TO RELATED APPLICATIONS

This application claims the benefit of U.S. Provisional Application No. 62/052,372, filed on Sep. 18, 2014, the entire contents of which are hereby incorporated by reference herein.

TECHNICAL FIELD

Embodiments of the present disclosure are in the field of renewable energy and, in particular, include approaches for foil-based metallization of solar cells.

BACKGROUND

Photovoltaic cells, commonly known as solar cells, are well known devices for direct conversion of solar radiation into electrical energy. Generally, solar cells are fabricated on a semiconductor wafer or substrate using semiconductor processing techniques to form a p-n junction near a surface of the substrate. Solar radiation impinging on the surface of, and entering into, the substrate creates electron and hole pairs in the bulk of the substrate. The electron and hole pairs migrate to p-doped and n-doped regions in the substrate, thereby generating a voltage differential between the doped regions. The doped regions are connected to conductive regions on the solar cell to direct an electrical current from the cell to an external circuit coupled thereto.

Efficiency is an important characteristic of a solar cell as it is directly related to the capability of the solar cell to generate power. Likewise, efficiency in producing solar cells is directly related to the cost effectiveness of such solar cells. Accordingly, techniques for increasing the efficiency of solar cells, or techniques for increasing the efficiency in the manufacture of solar cells, are generally desirable. Some embodiments of the present disclosure allow for increased solar cell manufacture efficiency by providing novel processes for fabricating solar cell structures. Some embodiments of the present disclosure allow for increased solar cell efficiency by providing novel solar cell structures.

BRIEF DESCRIPTION OF THE DRAWINGS

FIGS. 1-4, 5A and 5B illustrate angled views of various stages in the fabrication of a solar cell using foil-based metallization, in accordance with an embodiment of the present disclosure, wherein:

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, brief summary or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. §112, sixth paragraph, for that unit/component.

"First," "Second," etc. As used herein, these terms are used as labels for nouns that they precede, and do not imply any type of ordering (e.g., spatial, temporal, logical, etc.). For example, reference to a "first" solar cell does not necessarily imply that this solar cell is the first solar cell in a sequence; instead the term "first" is used to differentiate this solar cell from another solar cell (e.g., a "second" solar cell).

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

Approaches for foil-based metallization of solar cells are described herein. In the following description, numerous specific details are set forth, such as specific process flow operations, in order to provide a thorough understanding of embodiments of the present disclosure. It will be apparent to one skilled in the art that embodiments of the present disclosure may be practiced without these specific details. In other instances, well-known fabrication techniques, such as emitter region fabrication techniques, are not described in detail in order to not unnecessarily obscure embodiments of the present disclosure. Furthermore, it is to be understood that the various embodiments shown in the figures are illustrative representations and are not necessarily drawn to scale.

Disclosed herein are methods of fabricating solar cells. In one embodiment, a method of fabricating a solar cell involves placing a metal foil over a metalized surface of a wafer of the solar cell. The method further involves placing a protection layer over the metal foil. The method further involves locating the metal foil with the metalized surface of the wafer. The protection layer preserves an optically consistent surface of the metal foil during the locating. The method also involves, subsequent to the locating, electrically contacting the metal foil to the metalized surface of the wafer.

In another embodiment, a method of sequentially fabricating a plurality of solar cells involves placing a first metal foil over a metalized surface of a wafer of a first solar cell. The method also involves placing a protection layer over the first metal foil. The method also involves fitting-up the first metal foil with the metalized surface of the wafer of the first solar cell. The protection layer preserves an optically consistent surface of the first metal foil during the fitting-up. The method also involves, subsequent to the fitting-up, removing the protection layer from the first metal foil. The method also involves, subsequently, placing a second metal foil over a metalized surface of a wafer of a second solar cell, placing the protection layer over the second metal foil, fitting-up the second metal foil with the metalized surface of the wafer of the second solar cell, and removing the protection layer from the second metal foil.

In another embodiment, a method of fabricating a solar cell involves placing a metal foil over a metalized surface of a wafer of the solar cell. The metal foil is pre-cut to have a surface area on a scale similar to a surface area of the wafer of the solar cell but with one or more regions of overhang beyond the surface area of the wafer of the solar cell. The method also involves placing a protection layer over the metal foil. The method also involves fitting-up the metal foil with the metalized surface of the wafer. The protection layer preserves an optically consistent surface of the metal foil during the fitting-up. The method also involves, subsequent to the fitting-up, laser welding the metal foil to the metalized surface of the wafer. The method also involves, subsequent to laser welding the metal foil to the metalized surface of the wafer, cutting the metal foil to remove the one or more regions of overhang.

One or more embodiments described herein may involve use of a protection layer during foil-based solar cell device metallization fabrication. In an embodiment, a protective layer is implemented during backplane metal layer attachment in a solar cell. A laser transparent sheet is placed over the stacked wafer plus backplane metal layer (foil) before the fit-up and welding process. The transparent sheet can act as a protective layer during the fit-up process and/or can allow for pre-cut backplane metal layers to be used in the assembly. It is to be appreciated that the backplane designation herein may signify the M2 layer in a M1/M2 type solar cell structure, and where the M2 layer is a foil. In an embodiment, generally, a protective sheet is removably placed over a stack of a metal foil and a metalized surface of a wafer of the solar cell to prepare the metal foil and the metalized surface of the wafer for attachment.

To provide context, a fit-up process for creating intimate contact between a wafer with an M1 layer and a foil constituting the M2 layer can be a mechanically harsh process. Furthermore, it is known that the control of the welding process may be critically affected by the surface quality of the foil material. The fit-up process is known to affect the surface quality of the foil including, but not limited to, streaking the foil, scuffing the foil surface, stretching the foil and creating bubbles between the foil and the wafer. Additionally, the M2 layer is typically a foil piece that must extend substantially beyond the wafer edge so that vacuum can be used to hold the foil in place during the fit-up process and subsequent laser processing. The bulk of the excess material is usually discarded, thereby increasing the fabrication cost.

To provide further context, a metal foil used for fabrication of a backplane in a solar cell can be implemented as follows: (1) a metallized wafer is placed on a chuck (metal away from the chuck) and the wafer is held in place with vacuum, (2) a metal foil is placed over the wafer where the foil extends substantially over the wafer in all directions and the foil is held in place with vacuum, (3) a mechanical process, such as a squeegee, is implemented to remove air and physical gaps between the foil and wafer, (4) the foil is laser welded to the wafer, and (5) a laser is used to trim the excess foil from the wafer.

Addressing one or more of the above issues, in accordance with an embodiment of the present disclosure, a metal foil is implemented as a backplane in a solar cell fabrication process as follows: (1) a metallized wafer is placed on a chuck (metal away from the chuck) and the wafer is held in place with vacuum, (2) a metal foil is placed over the wafer where the foil can (a) extend substantially over the wafer in all directions or (b) is substantially the same size as the wafer and the foil is held in place with a vacuum, (3) a laser transparent layer is placed over the stack where the transparent layer is substantially larger than the wafer and foil (and may be held in place with a vacuum), (4) a mechanical process such as a squeegee is used to remove air and physical gaps between the foil and wafer where the transparent layer protects the foil from changes caused by the fit-up action, (5) the foil is laser welded to the wafer, (6) the transparent layer is removed, and (7) optionally, a laser is used to trim the excess foil from the wafer if the foil is larger than the wafer. Advantages of the above process scheme may include lower cost of fabrication due to higher yield with the same resulting structure from the existing process flow.

Other embodiments contemplated herein may include use of a smaller transparent layer that is substantially the size of the wafer and protects the foil surface during the fit-up process. In such a case, the foil may be substantially larger than the wafer. In some embodiments, the foil may have through-holes to allow vacuum pass through for holding the transparent layer in place, such as near the corners of the solar cell. The foil may also or instead be held in place by other approaches such as application of an adhesive, inside or outside the wafer area, or electrostatic attraction.

Some embodiments involve use of a foil that is approximately the same size as the wafer and has tabs extending past the wafer edge, or is somewhat larger than the wafer to allow vacuum or mechanical hold down. Some embodiments involve performing minor trim operations on the foil where the majority of the foil is sized the same as the wafer but tabs and or attachments remain on the foil, which are trimmed off in the final operation. Some embodiments involve removing a protection layer prior to laser processing, in which case the layer need not be laser transparent. Some embodiments involve use of a disposable or reusable transparent layer. Some embodiments involve use adhesives to hold the layers in place (such as at the wafer corners) instead of vacuum suction. Some embodiments involve perforating a metal foil with through-holes for vacuum pass through to hold the transparent layer in place during fit-up.

In a first aspect, a foil and solar cell pairing approach is applied using a protection layer on the metal foil. Consistent with the first aspect, FIGS. 1-4, 5A and 5B illustrate angled views of various stages in the fabrication of a solar cell using foil-based metallization. FIG. 6 is a flowchart listing operations in a method of fabricating a solar cell as corresponding to FIGS. 1-4, 5A and 5B, in accordance with an embodiment of the present disclosure.

Referring to operation 602 of flowchart 600, a method of fabricating a solar cell involves placing a metal foil over a metalized surface of a wafer of the solar cell. Referring to corresponding FIGS. 1 and 2, a metal foil 108 is placed on a wafer 102 having a plurality of emitter regions 104 (which may include metal seed regions) disposed on or above a substrate 106.

In an embodiment, the metallized surface of the wafer 102 includes alternating N-type and P-type semiconductor regions and a plurality of metal seed material regions on each of the alternating N-type and P-type semiconductor regions, as is described in greater detail below in association with FIGS. 7A-7C. In an embodiment, the metal foil sheet 108 is an aluminum (Al) foil having a thickness approximately in the range of 5-100 microns. In one embodiment, the Al foil is an aluminum alloy foil including aluminum and second element such as, but not limited to, copper, manganese, silicon, magnesium, zinc, tin, lithium, or combinations thereof. In one embodiment, the Al foil is a temper grade foil such as, but not limited to, F-grade (as fabricated), O-grade (full soft), H-grade (strain hardened) or T-grade (heat treated). In one embodiment, the aluminum foil is an anodized aluminum foil.

Referring to operation 604 of flowchart 600, the method further involves placing a protection layer over the metal foil. Referring to corresponding FIG. 3, a protection layer 110 is placed on or above the metal foil 108 in an orientation distal from the substrate 106. It is to be appreciated that the sizing of the protection layer may vary as needed. In the particular example shown in FIG. 3, in an embodiment, the protection sheet 110 has one dimension approximately the same as a dimension of the solar cell, and another direction extending beyond, and possibly well beyond, the solar cell (as indicated by the wavy edges of the protection layer 110).

In an embodiment, the metal foil sheet 108 is placed over the metalized surface of the wafer of the solar cell by adhering the metal foil sheet 108 to the metalized surface of the wafer of the solar cell via vacuum suction prior to placing the protection layer 110 over the metal foil sheet 108. In an embodiment, the metal foil sheet 108 has one or more holes there-through. The one or more holes are for enabling vacuum adhesion of the protection layer 110 to the metal foil sheet 108 during the placing the protection layer 110 over the metal foil sheet 108. Greater detail of the latter embodiment is described below in association with FIGS. 9A-9D.

Figure 1:
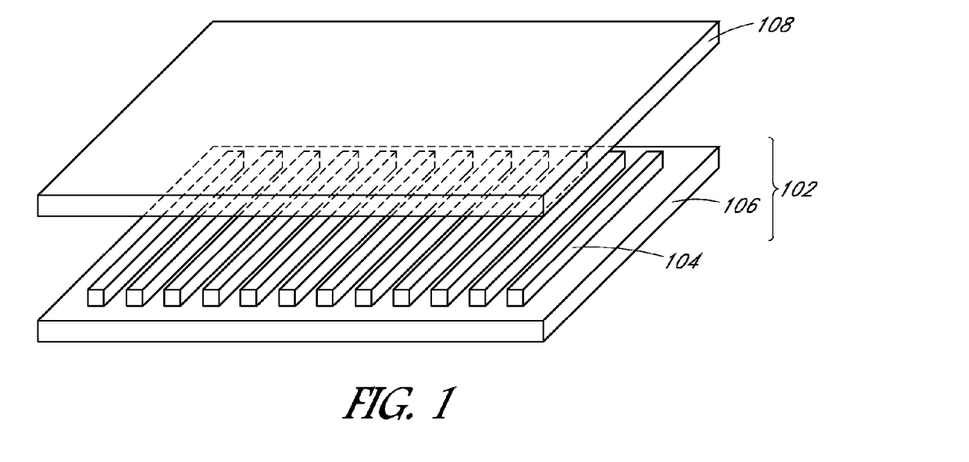
FIGS. 1 and 2 illustrate a stage in solar cell fabrication involving placing of a metal foil on a wafer having a plurality of emitter regions disposed on or above a substrate.
Figure 2:
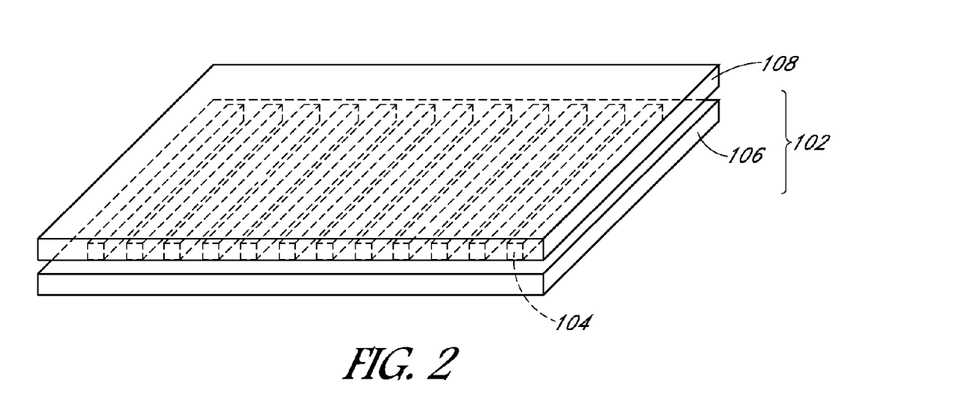
Figure 3:
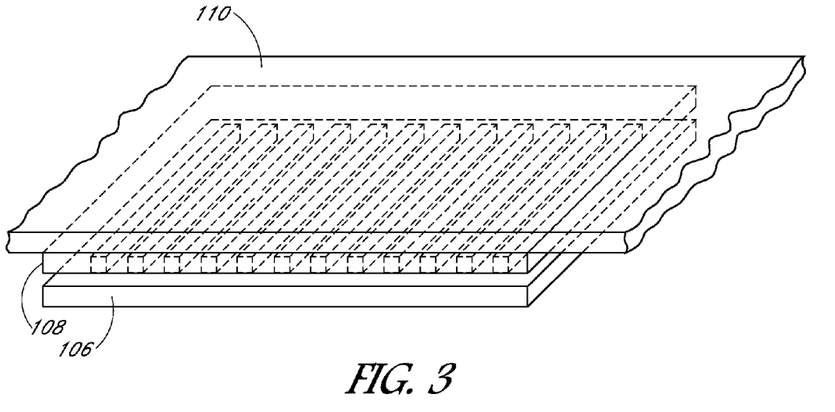
FIG. 3 illustrates the structure of FIG. 2 following placement of a protection layer on or above the metal foil in an orientation distal from the substrate.
Figure 4:
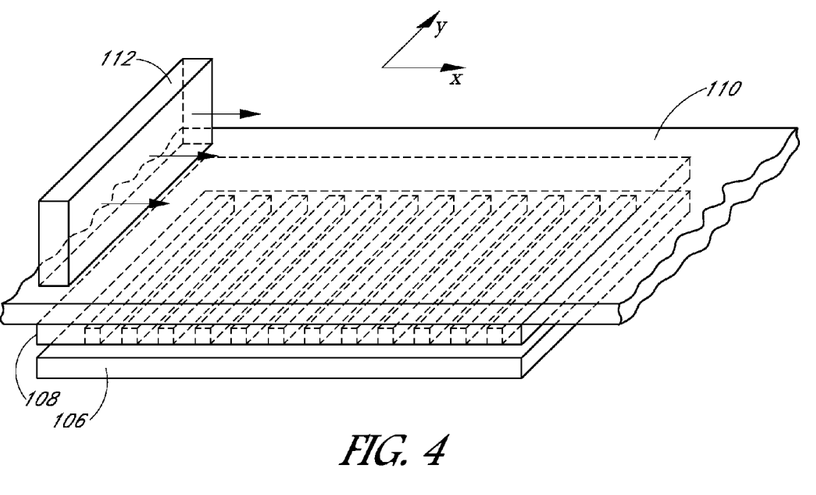
FIG. 4 illustrates the structure of FIG. 3 following locating of the metal foil with the metalized surface of the wafer.

Referring to operation 608 of flowchart 600, the method further involves locating the metal foil with the metalized surface of the wafer. Referring to corresponding FIG. 4, the metal foil 108 is fit-up with the underlying solar cell. In one such embodiment, pressure is applied by an applicator 112 which provides a downward force onto the protection layer 110 and, ultimately, onto the metal foil 108. The applicator may be moved (while providing downward pressure) across the protection layer 110 to ultimately fit-up the metal foil 108 with the entire underlying solar cell, as is represented by the arrows in FIG. 4. In one embodiment, the applicator 112 is moved along the x-direction, effectively orthogonal to the direction of the plurality of emitter regions 104, as is depicted in FIG. 4. In other embodiments, however, the applicator 112 is moved along the y-direction, effectively parallel with the direction of the plurality of emitter regions 104.

In an embodiment, the metal foil is located with the metalized surface of the wafer via applying pressure by using an applicator such as, but not limited to, a roller, a diamond-shaped applicator, or a squeegee. In one such embodiment, applying pressure by using the applicator involves removing air and physical gaps from between the metal foil and the metalized surface of the wafer.

In an embodiment, the protection layer 110 preserves an optically consistent surface of the metal foil 108 during the locating. In one such embodiment, the optically consistent surface of the metal foil during the locating is preserved by forming essentially no deformation in the metal foil. In another such embodiment, the optically consistent surface of the metal foil during the locating is preserved by slightly deforming the metal foil, but not streaking, stretching or scuffing the metal foil.

In an embodiment, the protection layer 110 is or includes a material such as a polyurethane or the like material. In an embodiment, the protection layer 110 is a single use layer that may or may not be retained with the metal foil in subsequent processing operations. In another embodiment, the protection layer 110 is a multiple use layer for repeated use in a manufacturing process, as is described in greater detail below in association with FIG. 8.

Referring to operation 610 of flowchart 600, the method further involves, subsequent to the locating, electrically contacting the metal foil to the metalized surface of the wafer. Referring to corresponding FIGS. 5A and 5B, in an embodiment, laser irradiation 112 is applied to form laser weld spots 114 between the metal foil 108 and the plurality of emitter regions 104.

Figure 5A:
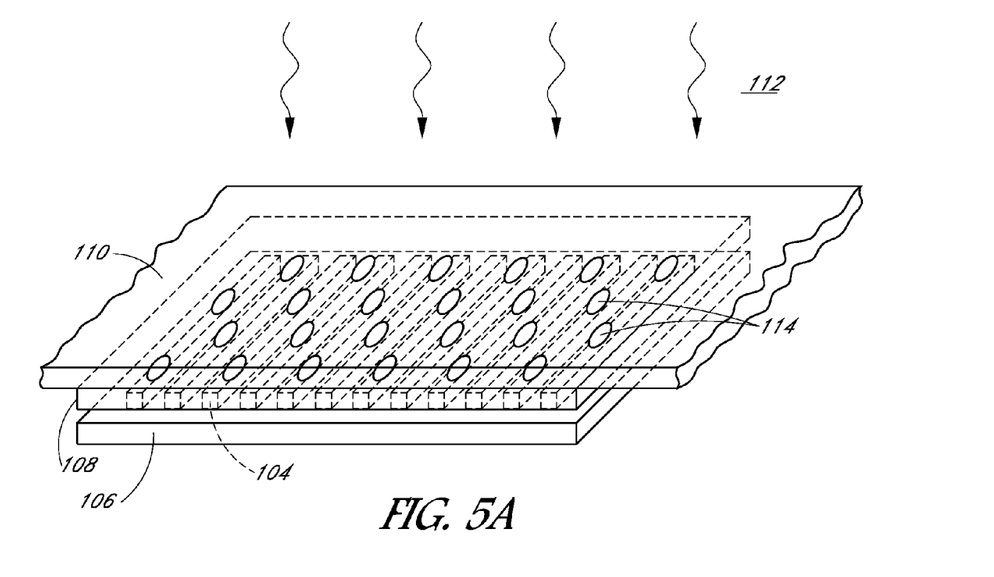
FIGS. 5A and 5B illustrate the structure of FIG. 4 following electrical contacting of the metal foil to the metalized surface of the wafer, with different options shown in FIGS. 5A and 5B.
Figure 5B:
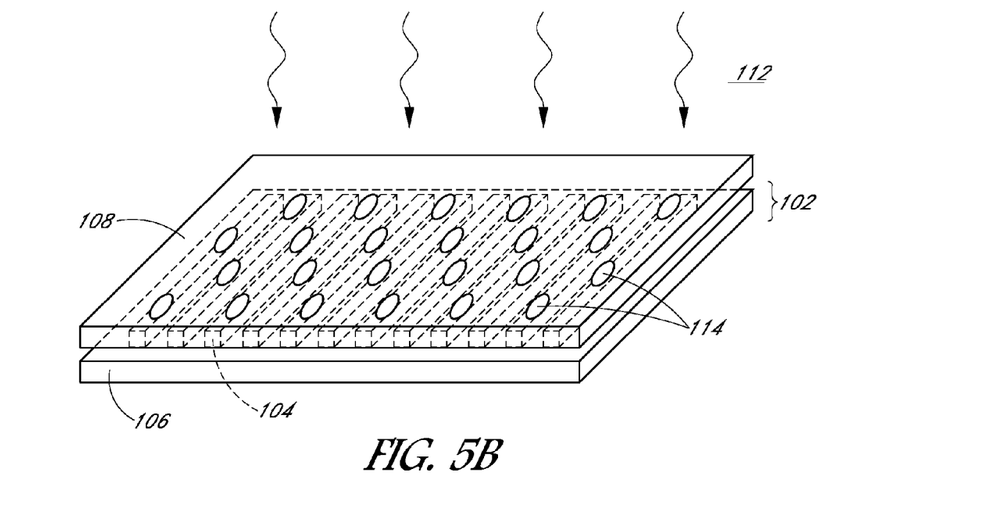
Figure 6:
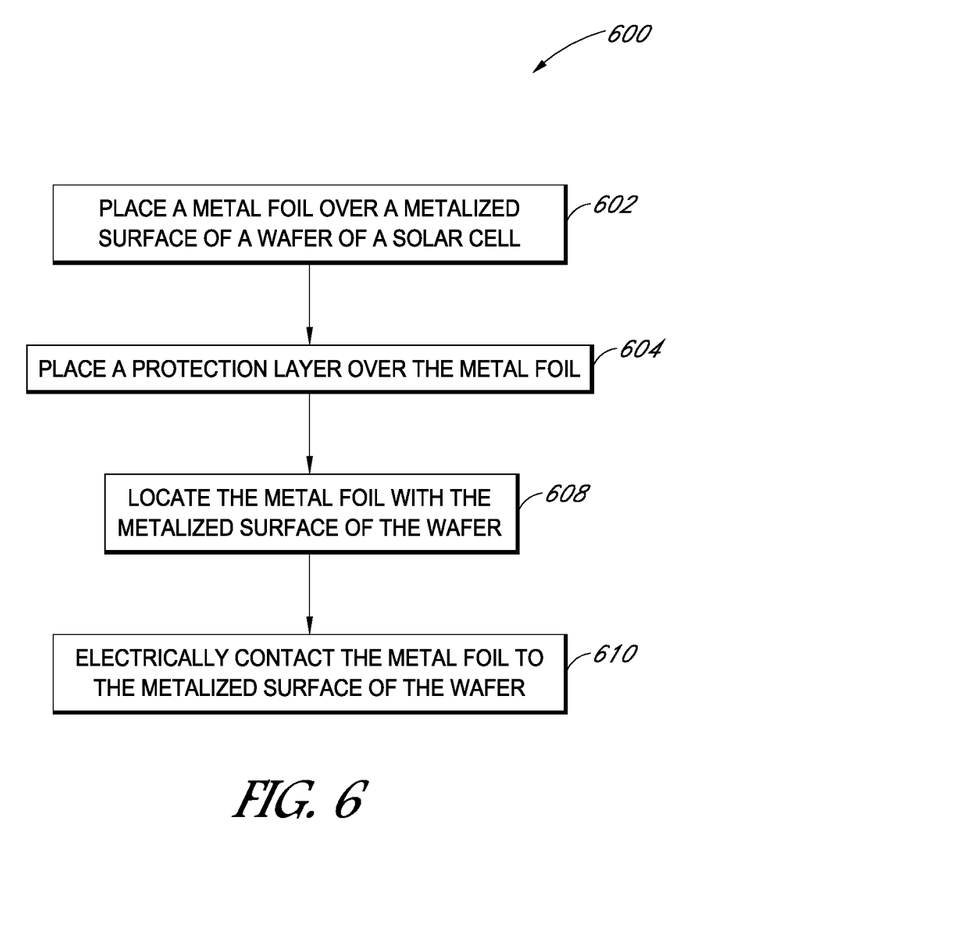
FIG. 6 is a flowchart listing operations in a method of fabricating a solar cell as corresponding to FIGS. 1-4, 5A and 5B, in accordance with an embodiment of the present disclosure.

Referring specifically to FIG. 5A, in one embodiment, electrically contacting the metal foil to the metalized surface of the wafer involves laser welding through the protection layer. In one such embodiment, the protection layer is substantially transparent to a laser used for the laser welding. In an embodiment, subsequent to the laser welding, the protection layer is removed from the metal foil. Referring to FIG. 5B, in another embodiment, the protection layer is removed from the metal foil prior to the electrical contacting, e.g., prior to a laser welding operation.

In an embodiment, the metal foil has a surface area substantially larger than a surface area of the wafer of the solar cell, and the method further involves, subsequent to electrically contacting the metal foil to the metalized surface of the wafer, cutting to the metal foil to provide the metal foil having a surface area substantially the same as the surface area of the wafer of the solar cell. In another embodiment, the method further involves, prior to placing the metal foil over the metalized surface of the wafer of the solar cell, cutting a large sheet of foil to provide the metal foil having a surface area substantially the same as a surface area of the wafer of the solar cell. Greater detail of the latter embodiment is described below in association with FIGS. 9A-9D.

It is to be appreciated that coupling of a metal foil with underlying emitter regions of a solar cell (or metal seed regions on the emitter regions) need not require direct coupling of all contact points of the metal foil and the solar cell. Referring again to FIGS. 5A and 5B, laser welding is performed in only certain locations in order to generate weld spots 114 adhering the foil 108 to the plurality of emitter regions 104.

In an embodiment, the resulting structures of FIGS. 5A and 5B are subjected to a contact metallization patterning process. As an example, FIGS. 7A-7C illustrate cross-sectional views of various stages in the fabrication of a solar cell using foil-based metallization, in accordance with an embodiment of the present disclosure.

Figure 7A:
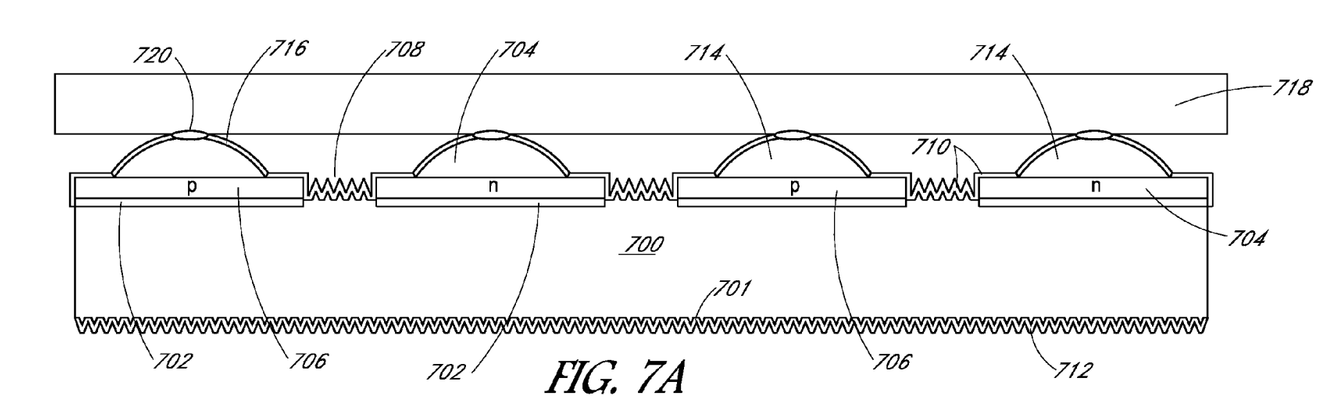
FIGS. 7A-7C illustrate cross-sectional views of various stages in the fabrication of a solar cell using foil-based metallization, in accordance with an embodiment of the present disclosure.

Referring to FIG. 7A, a plurality of alternating N-type and P-type semiconductor regions are disposed above a substrate. In particular, a substrate 700 has disposed there above N-type semiconductor regions 704 and P-type semiconductor regions 706 disposed on a thin dielectric material 702 as an intervening material between the N-type semiconductor regions 704 or P-type semiconductor regions 706, respectively, and the substrate 700. The substrate 700 has a light-receiving surface 701 opposite a back surface above which the N-type semiconductor regions 704 and P-type semiconductor regions 706 are formed.

In an embodiment, the substrate 700 is a monocrystalline silicon substrate, such as a bulk single crystalline N-type doped silicon substrate. It is to be appreciated, however, that substrate 700 may be a layer, such as a multi-crystalline silicon layer, disposed on a global solar cell substrate. In an embodiment, the thin dielectric layer 702 is a tunneling silicon oxide layer having a thickness of approximately 2 nanometers or less. In one such embodiment, the term "tunneling dielectric layer" refers to a very thin dielectric layer, through which electrical conduction can be achieved. The conduction may be due to quantum tunneling and/or the presence of small regions of direct physical connection through thin spots in the dielectric layer. In one embodiment, the tunneling dielectric layer is or includes a thin silicon oxide layer.

In an embodiment, the alternating N-type and P-type semiconductor regions 704 and 706, respectively, are formed from polycrystalline silicon formed by, e.g., using a plasma-enhanced chemical vapor deposition (PECVD) process. In one such embodiment, the N-type polycrystalline silicon emitter regions 704 are doped with an N-type impurity, such as phosphorus. The P-type polycrystalline silicon emitter regions 706 are doped with a P-type impurity, such as boron. As is depicted in FIG. 7A, the alternating N-type and P-type semiconductor regions 704 and 706 may have trenches 708 formed there between, the trenches 708 extending partially into the substrate 700. Additionally, in one embodiment, a bottom anti-reflective coating (BARC) material 710 or other protective layer (such as a layer amorphous silicon) is formed on the alternating N-type and P-type semiconductor regions 704 and 706, as is depicted in FIG. 7A.

In an embodiment, the light receiving surface 701 is a texturized light-receiving surface, as is depicted in FIG. 7A. In one embodiment, a hydroxide-based wet etchant is employed to texturize the light receiving surface 701 of the substrate 700 and, possibly, the trench 708 surfaces as is also depicted in FIG. 7A. It is to be appreciated that the timing of the texturizing of the light receiving surface may vary. For example, the texturizing may be performed before or after the formation of the thin dielectric layer 702. In an embodiment, a texturized surface may be one which has a regular or an irregular shaped surface for scattering incoming light, decreasing the amount of light reflected off of the light receiving surface 701 of the solar cell. Referring again to FIG. 7A, additional embodiments can include formation of a passivation and/or anti-reflective coating (ARC) layers (shown collectively as layer 712) on the light-receiving surface 701. It is to be appreciated that the timing of the formation of passivation and/or ARC layers may also vary.

Referring again to FIG. 7A, a plurality of metal seed material regions 714 is formed to provide a metal seed material region on each of the alternating N-type and P-type semiconductor regions 704 and 706, respectively. The metal seed material regions 714 make direct contact to the alternating N-type and P-type semiconductor regions 704 and 706. In an embodiment, the metal seed regions 714 are aluminum regions. In one such embodiment, the aluminum regions each have a thickness approximately in the range of 0.3 to 20 microns and include aluminum in an amount greater than approximately 97% and silicon in an amount approximately in the range of 0-2%. In other embodiments, the metal seed regions 714 include a metal such as, but not limited to, nickel, silver, cobalt or tungsten. Optionally, a protection layer may be included on the plurality of metal seed material regions 714. In a particular embodiment, an insulating layer 716 is formed on the plurality of metal seed material regions 714. In an embodiment, the insulating layer 716 is a silicon nitride or silicon oxynitride material layer. In another embodiment, in place of the metal seed regions 714, a blanket metal seed layer is used that is not patterned at this stage of processing. In that embodiment, the blanket metal seed layer may be patterned in a subsequent etching process, such as a hydroxide-based wet etching process.

Referring again to FIG. 7A, a metal foil 718 is adhered to the alternating N-type and P-type semiconductor regions by directly coupling portions of the metal foil 718 with a corresponding portion of each of the metal seed material regions 714. In one such embodiment, the direct coupling of portions of the metal foil 718 with a corresponding portion of each of the metal seed material regions 714 involves forming a metal weld 720 at each of such locations, as is depicted in FIG. 7A.

In an embodiment, the metal foil 718 is an aluminum (Al) foil having a thickness approximately in the range of 5-100 microns. In one embodiment, the Al foil is an aluminum alloy foil including aluminum and second element such as, but not limited to, copper, manganese, silicon, magnesium, zinc, tin, lithium, or combinations thereof. In one embodiment, the Al foil is a temper grade foil such as, but not limited to, F-grade (as fabricated), O-grade (full soft), H-grade (strain hardened) or T-grade (heat treated). In one embodiment, the aluminum foil is an anodized aluminum foil. In an embodiment, the metal foil 718 is adhered directly to the plurality of metal seed material regions 714 by using a technique such as, but not limited to, a laser welding process as described in association with FIGS. 5A and 5B. In an embodiment, the optional insulating layer 716 is included, and adhering the metal foil 718 to the plurality of metal seed material regions 714 involves breaking through regions of the insulating layer 716, as is depicted in FIG. 7A.

It is to be appreciated that, in accordance with another embodiment of the present disclosure, a seedless approach may be implemented. In such an approach, metal seed material regions 714 are not formed, and the metal foil 718 is adhered directly to the material of the alternating N-type and P-type semiconductor regions 704 and 706. For example, in one embodiment, the metal foil 718 is adhered directly to alternating N-type and P-type polycrystalline silicon regions. In either case, process may be described as adhering the metal foil to a metallized surface of a solar cell.

Figure 7B:
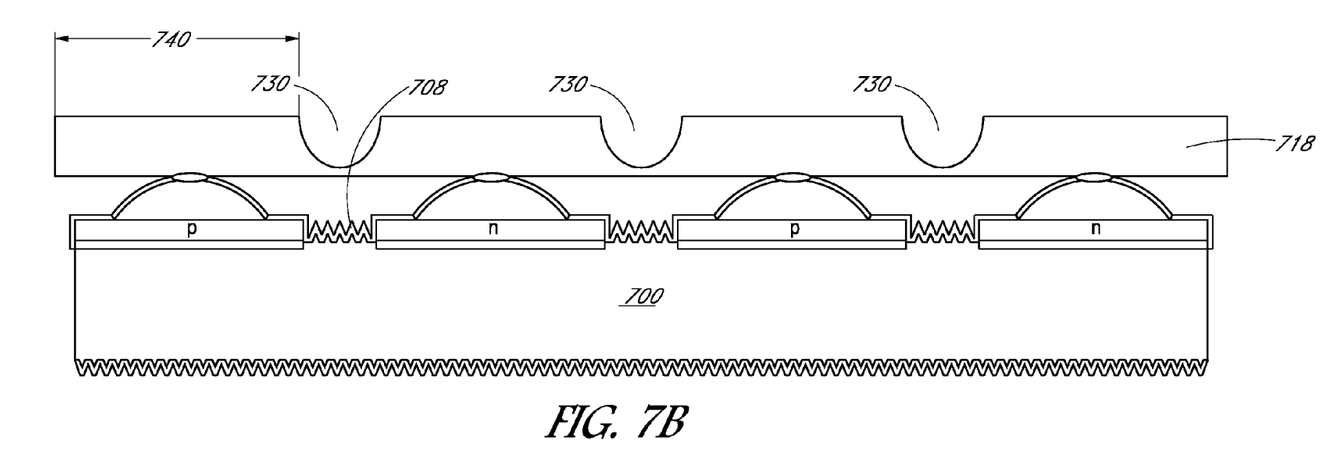
Figure 7C:
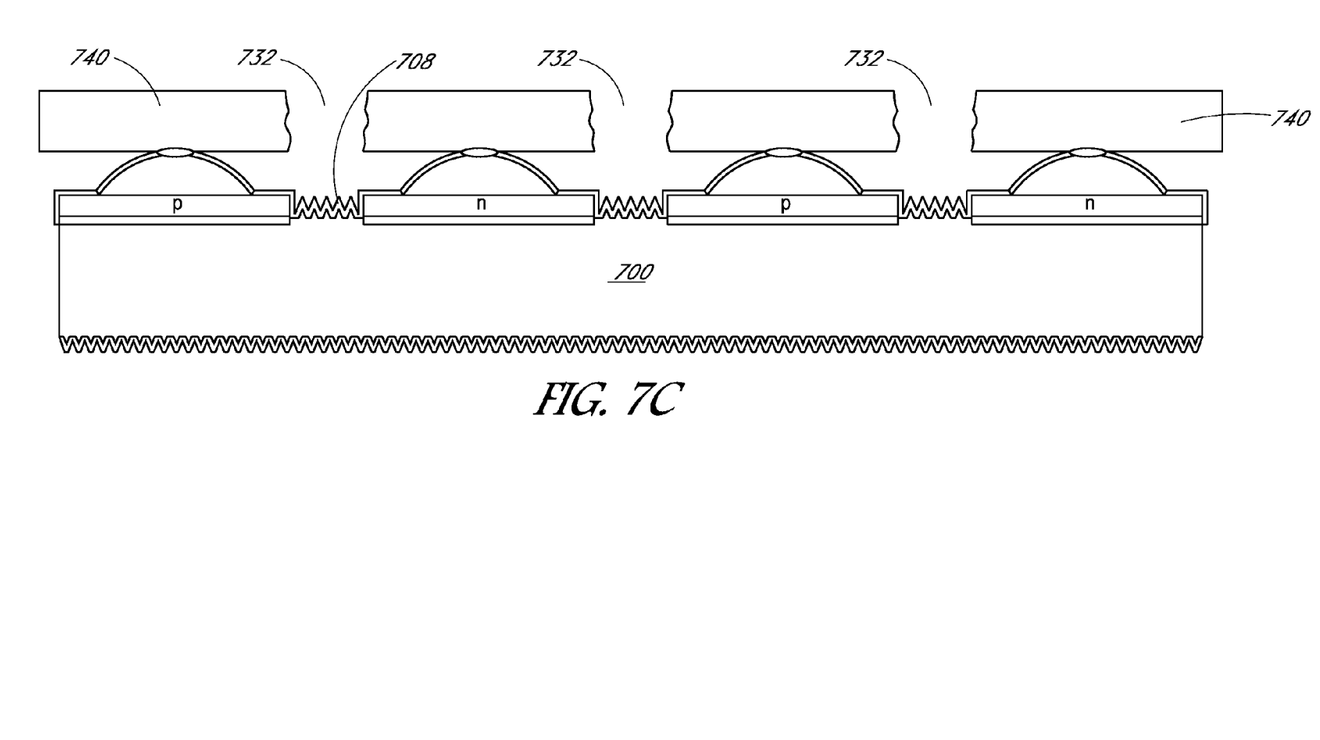

FIG. 7B illustrates the structure of FIG. 7A following formation of laser grooves in the metal foil. Referring to FIG. 7B, the metal foil 718 is laser ablated through only a portion of the metal foil 718 at regions corresponding to locations between the alternating N-type and P-type semiconductor regions 704 and 706, e.g., above trench 708 locations as is depicted in FIG. 7B. The laser ablating forms grooves 730 that extend partially into, but not entirely through, the metal foil 718. In an embodiment, forming laser grooves 730 involves laser ablating a thickness of the metal foil 718 approximately in the range of 80-99% of an entire thickness of the metal foil 718. That is, in one embodiment, it is critical that the lower portion of the metal foil 718 is not penetrated, such that metal foil 718 protects the underlying emitter structures.

The grooves 730 of FIG. 7B may then be used to isolate conductive regions 740 as metallization structures for the underlying emitter regions. For example, referring to FIG. 7C, the grooves 730 are extended to provide gaps 732 between conductive regions 740. In an embodiment, the patterned metal foil 718 is etched to isolate portions 740 of the metal foil 718. In one such embodiment, the structure of FIG. 7B is exposed to a wet etchant. Although the wet etchant etches all exposed portions of the metal foil 718, a carefully timed etch process is used to break through the bottoms of the laser grooves 730 without significantly reducing the thickness of the non-grooved regions 740 of the metal foil 718, as is depicted in FIG. 7C. In a particular embodiment, a hydroxide based etchant is used, such as, but not limited to, potassium hydroxide (KOH) or tetramethylammonium hydroxide (TMAH).

In another embodiment (not shown), the remaining metal foil 718 of FIG. 7B is subsequently anodized at exposed surfaces thereof to isolate regions 740 of the remaining metal foil 718 corresponding to the alternating N-type and P-type semiconductor regions 704 and 706. In particular, the exposed surfaces of the metal foil 718, including the surfaces of the grooves 730, are anodized to form an oxide coating. At locations corresponding to the alternating N-type and P-type semiconductor regions 704 and 706, e.g., in the grooves 730 at locations above the trenches 708, the entire remaining thickness of the metal foil 718 is anodized there through to isolate regions 740 of metal foil 718 remaining above each of the N-type and P-type semiconductor regions 704 and 706.

Figure 8:
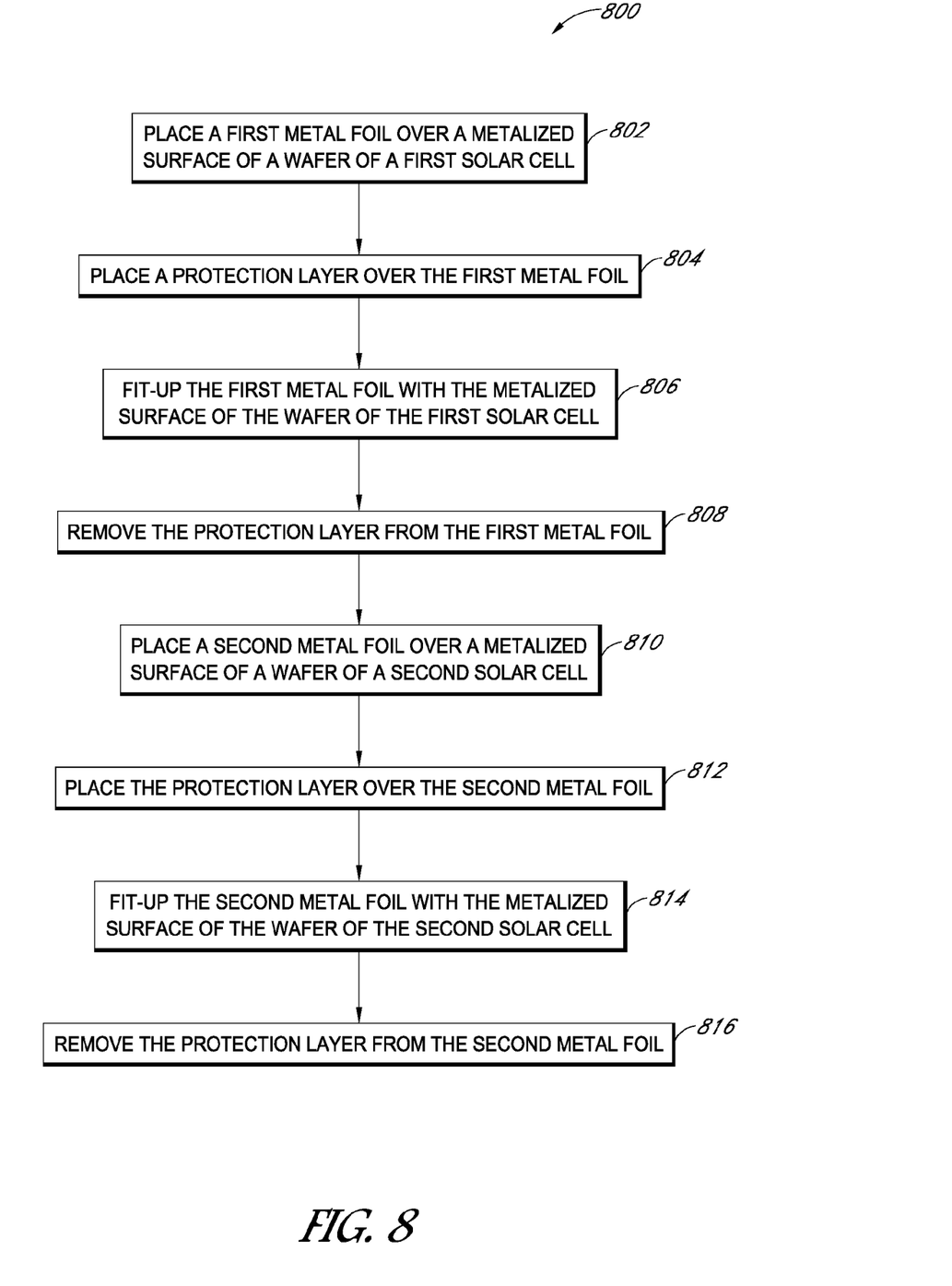
FIG. 8 is a flowchart listing operations in a method of fabricating a solar cell, in accordance with another embodiment of the present disclosure.

In a second aspect, a same protection layer may be used more than once in a manufacturing process involving adhering of a metal foil to a solar cell. As an example, FIG. 8 is a flowchart listing operations in a method of fabricating a solar cell, in accordance with another embodiment of the present disclosure.

Referring to operation 802 of flowchart 800, a method of sequentially fabricating a plurality of solar cells involves placing a first metal foil over a metalized surface of a wafer of a first solar cell. In operation 804, a protection layer is placed over the first metal foil. In operation 806, the first metal foil is fit-up with the metalized surface of the wafer of the first solar cell. The protection layer may be used to preserve an optically consistent surface of the first metal foil during the fitting-up. In operation 808, subsequent to the fitting-up, the protection layer is removed from the first metal foil. In operation 810, a second metal foil is placed over a metalized surface of a wafer of a second solar cell. In operation 812, the same protection layer is placed over the second metal foil. In operation 814, the second metal foil is fit-up with the metalized surface of the wafer of the second solar cell. In operation 816, the protection layer is removed from the second metal foil. It is to be appreciated that, although only two iterations of use of a same protection layer are described above, numerous iterations me be performed using the same protection layer in an assembly manufacturing process.

Referring again to operations 806 and 808 of flowchart 800, in an embodiment, subsequent to fitting-up the first metal foil with the metalized surface of the wafer of the first solar cell, the first metal foil is welded to the metalized surface of the wafer of the first solar cell. In one embodiment, laser welding the first metal foil to the metalized surface of the wafer of the first solar cell involves laser welding through the protection layer, as was described in association with FIG. 5A. However, in another embodiment, the protection layer is removed prior to the laser welding, as was described in association with FIG. 5B. Likewise, referring again to operations 814 and 816, in an embodiment, subsequent to fitting-up the second metal foil with the metalized surface of the wafer of the second solar cell, the second metal foil is welded to the metalized surface of the wafer of the second solar cell.

Figure 9A:
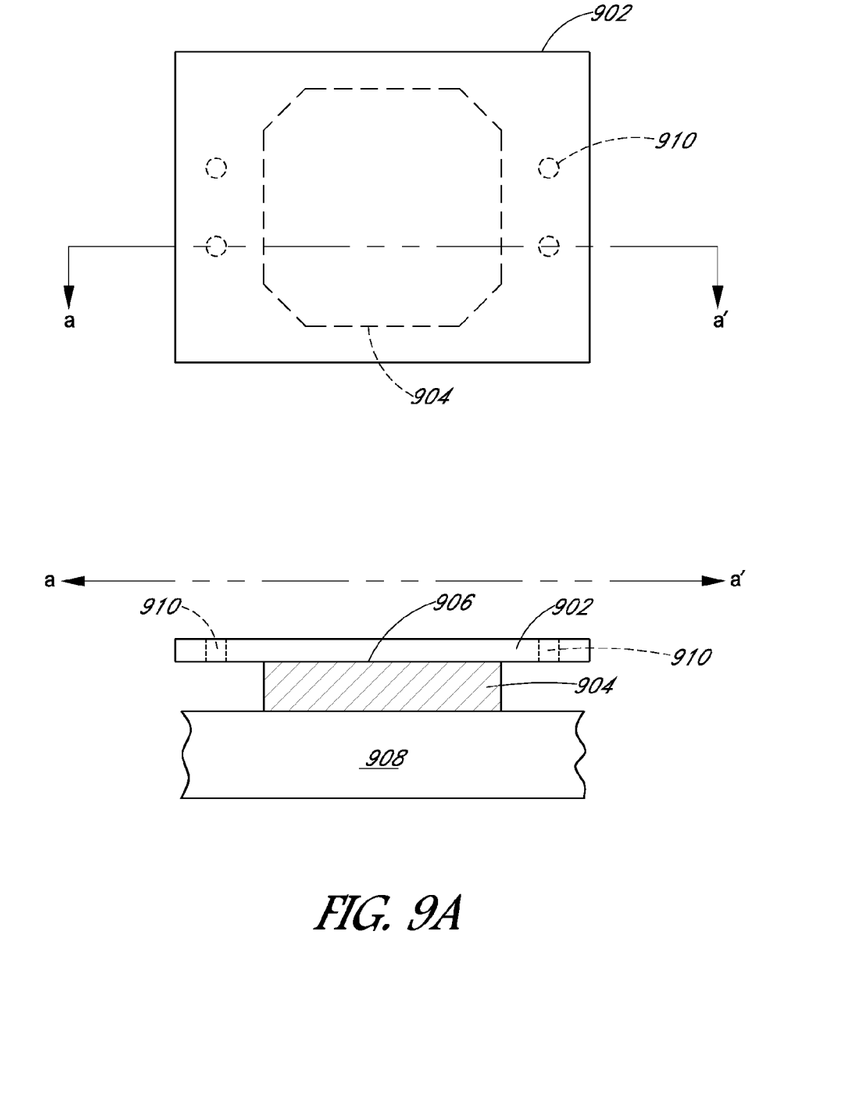
FIGS. 9A-9D illustrate plan views and corresponding cross-sectional views of various stages in the fabrication of a solar cell using foil-based metallization, in accordance with another embodiment of the present disclosure.
Figure 9B:
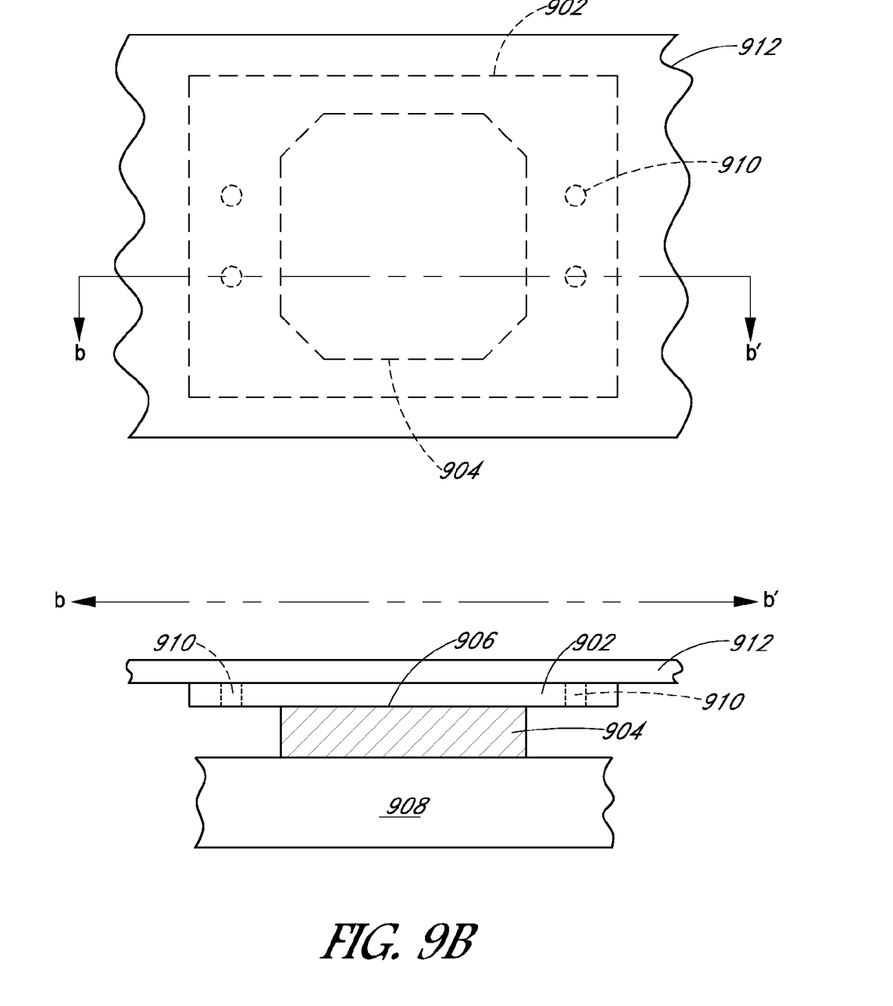

As described above, the metal foil may be a large sheet or may be otherwise pre-cut to have a size on a scale of the underlying solar cell prior to being adhered to the solar cell. In a third aspect, the latter scenario is described where a pre-cut foil and solar cell pairing approach is applied using a protection layer on the pre-cut metal foil. Consistent with the third aspect, FIGS. 9A-9D illustrate plan views and corresponding cross-sectional views of various stages in the fabrication of a solar cell using foil-based metallization. FIG. 10 is a flowchart listing operations in a method of fabricating a solar cell as corresponding to FIGS. 9A-9D, in accordance with an embodiment of the present disclosure.

Referring to operation 1002 of flowchart 1000, a method of fabricating a solar cell involves placing a metal foil over a metalized surface of a wafer of the solar cell. Referring to corresponding FIG. 9A, the upper plan view depicts a pre-cut metal foil 902 placed over an underlying wafer 904 (shown as dashed lines). The lower cross-sectional view (taken along the a-a' axis of the upper plan view) depicts the pre-cut metal foil 902 as attached to the metallized surface 906 of the wafer 904. The underlying wafer 904 is supported by a support 908 which, in one embodiment, is a chuck.

In an embodiment, the metal foil 902 is pre-cut (e.g., from a large metal foil sheet) to have a surface area on a scale similar to a surface area of the wafer 904 of the solar cell. In one such embodiment, one or more regions of overhang beyond the surface area of the wafer 904 of the solar cell may be present and still referred to as being of a size of a similar scale. In an embodiment, holes 910 may be formed some regions of the metal foil 902 for enabling vacuum suction of an overlying protection layer, as is described below.

In an embodiment, the pairing of the pre-cut metal foil 902 and the wafer 904 is held on the support 908 by clamping or by vacuum suction. In the latter embodiment, vacuum suction may be achieved using vacuum holes or ports formed in the support 908. Thus, in one embodiment, the pre-cut metal foil 902 is adhered to the metalized surface 906 of the wafer 904 of the solar cell by vacuum suction prior to placing a protection layer over the metal foil.

Referring to operation 1004 of flowchart 1000, the method further involves placing a protection layer over the metal foil. Referring to corresponding FIG. 9B, the upper plan view and lower cross-sectional view (taken along the b-b' axis of the upper plan view) depict a protection layer 912 placed over the structure of FIG. 9A. In one embodiment, the holes 910 in the pre-cut metal foil 902 described above can be used to enable vacuum suction of the protection layer 912 onto the pre-cut metal foil 902.

Referring to operation 1006 of flowchart 1000, the method further involves fitting-up the metal foil with the metalized surface of the wafer. In an embodiment, the fitting-up may be achieved in a manner similar to one or more of the approaches described in association with FIG. 4. In an embodiment, the protection layer 912 preserves an optically consistent surface of the metal foil 902 during the fitting-up.

Referring to operation 1008 of flowchart 1000, the method further involves, subsequent to the fitting-up, laser welding the metal foil to the metalized surface of the wafer. Referring to corresponding FIG. 9C, the upper plan view and lower cross-sectional view (taken along the c-c' axis of the upper plan view) depict a plurality of laser welds formed between the metal foil 902 and the metallized surface 906 of the underlying wafer 904.

Figure 9C:
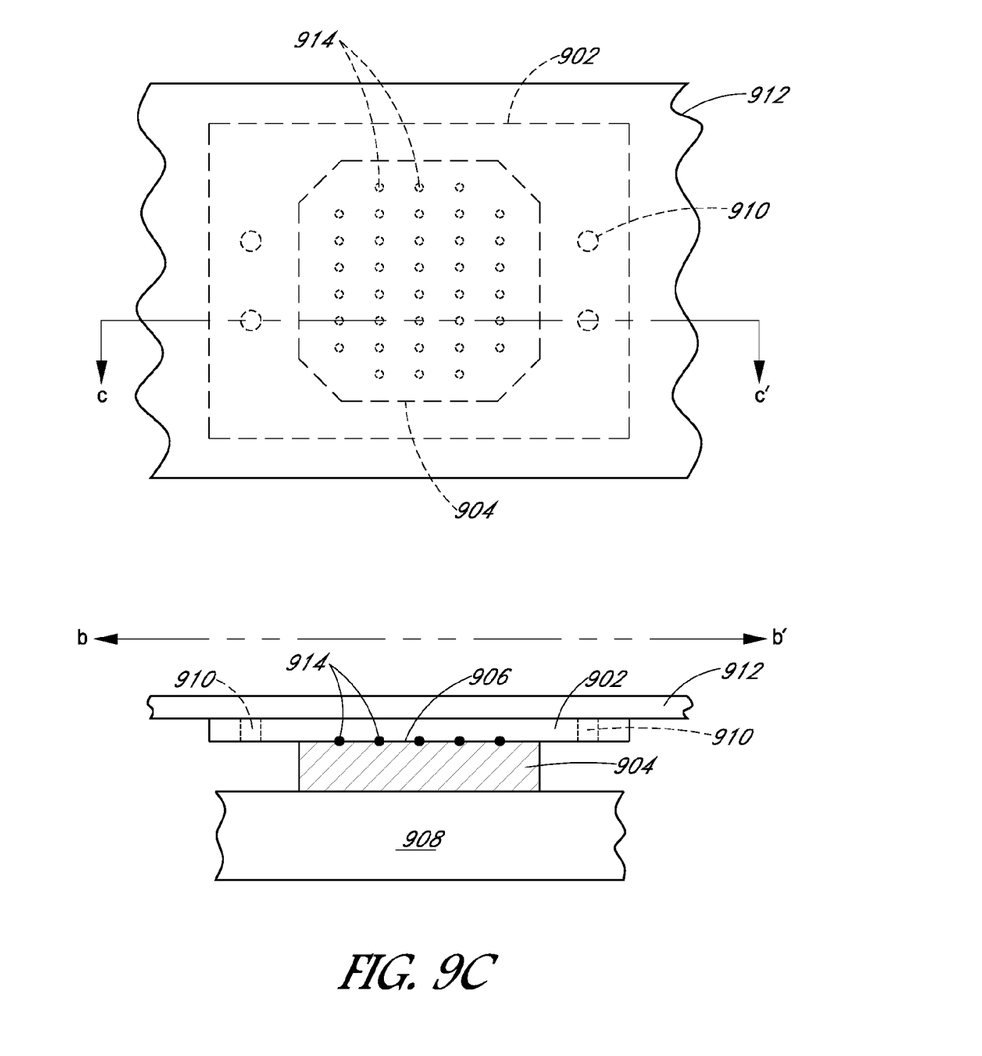
Figure 9D:
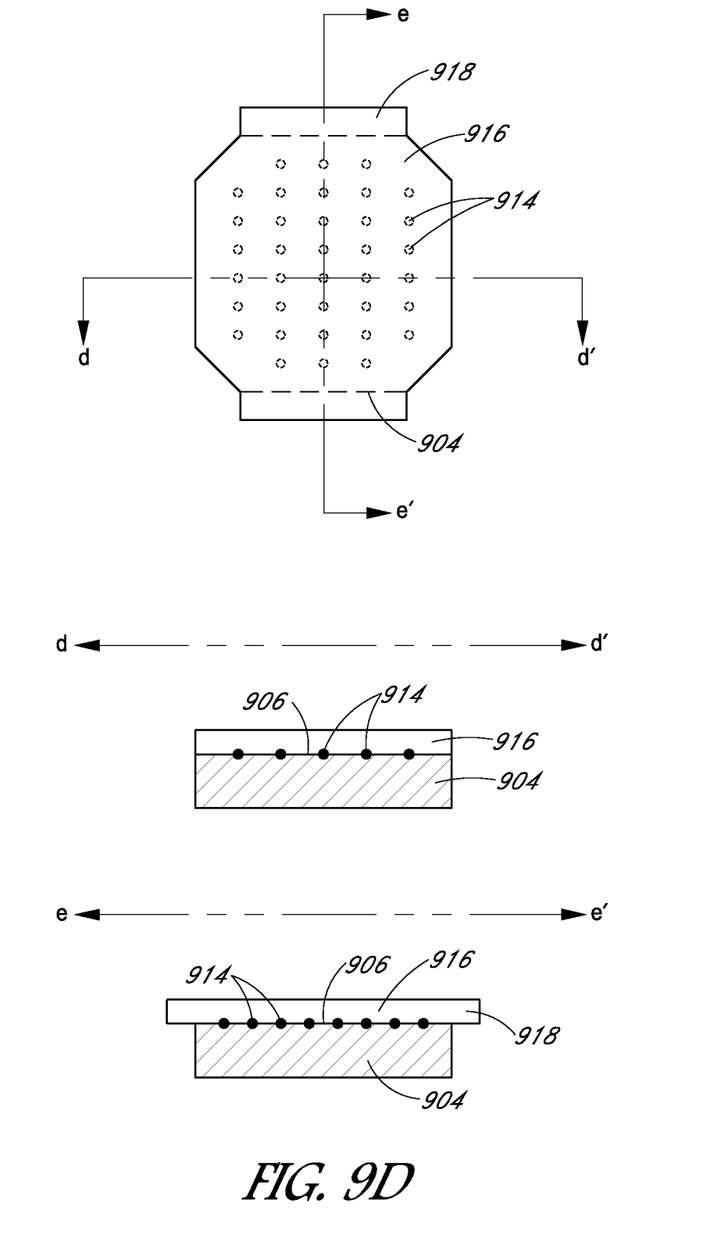
Figure 10:
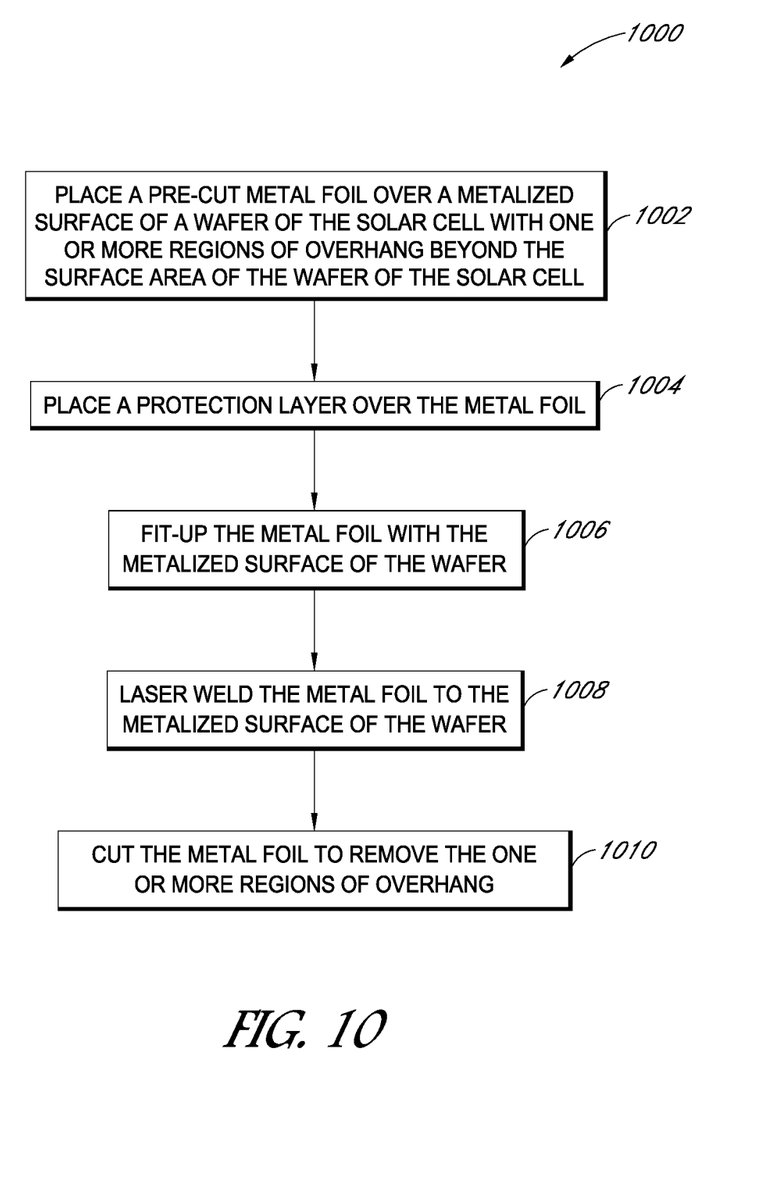
FIG. 10 is a flowchart listing operations in a method of fabricating a solar cell as corresponding to FIGS. 9A-9D, in accordance with an embodiment of the present disclosure.

In an embodiment, the laser welding involves laser welding through the protection layer 902, as is the case depicted in FIG. 9C. In one such embodiment, the protection layer 912 is substantially transparent to a laser used for the laser welding and, subsequent to the laser welding, the protection layer 912 is removed from the metal foil 902. In another embodiment, however, the protection layer 912 is removed from the metal foil 902 prior to the laser welding.

Referring to operation 1010 of flowchart 1000, the method further involves, subsequent to laser welding the metal foil to the metalized surface of the wafer, cutting the metal foil to remove the one or more regions of overhang. Referring to corresponding FIG. 9D, the upper plan view depicts a further cut or shaped metal foil 916 having a perimeter substantially the same as the perimeter of the underlying wafer 904 (a portion of the perimeter of which is indicated by the dashed lines). Thus, referring to the middle cross-sectional view (taken along the d-d' axis of the upper plan view), one or more regions of overhang of the metal foil 902 of removed. However, referring to the lower cross-sectional view (taken along the e-e' axis of the upper plan view), one or more regions of overhang 918 of the metal foil 902 may be preserved. The metal foil 902 may be cut or shaped to provide metal foil 916 by, e.g., tearing or laser scribing, or a combination thereof. Subsequent to, forming the cut or shaped metal foil 916, regions of the cut or shaped metal foil 916 over the wafer 904 may be patterned, as described in association with FIGS. 7A-7C.

Although certain materials are described specifically with reference to above described embodiments, some materials may be readily substituted with others with other such embodiments remaining within the spirit and scope of embodiments of the present disclosure. For example, in an embodiment, a different material substrate, such as a group III-V material substrate, can be used instead of a silicon substrate. Additionally, although reference is made significantly to back contact solar cell arrangements, it is to be appreciated that approaches described herein may have application to front contact solar cells as well. In other embodiments, the above described approaches can be applicable to manufacturing of other than solar cells. For example, manufacturing of light emitting diode (LEDs) may benefit from approaches described herein.

Thus, approaches for foil-based metallization of solar cells and the resulting solar cells have been disclosed.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method of fabricating a solar cell, the method comprising:
   placing a metal foil over a metalized surface of a wafer of the solar cell;
   placing a protection layer over the metal foil;
   locating the metal foil with the metalized surface of the wafer, wherein the protection layer preserves an optically consistent surface of the metal foil during the locating;
   subsequent to the locating, electrically contacting the metal foil to the metalized surface of the wafer; and
   subsequent to electrically contacting the metal foil to the metalized surface of the wafer, removing the protection layer from the metal foil.

2. The method of claim 1, wherein electrically contacting the metal foil to the metalized surface of the wafer comprises laser welding through the protection layer.

3. The method of claim 2, wherein the protection layer is substantially transparent to a laser used for the laser welding.

4. The method of claim 1, wherein preserving the optically consistent surface of the metal foil during the locating comprises slightly deforming the metal foil, but not streaking, stretching or scuffing the metal foil.

5. The method of claim 1, wherein preserving the optically consistent surface of the metal foil during the locating comprises forming essentially no deformation in the metal foil.

6. The method of claim 1, wherein the metal foil has a surface area substantially larger than a surface area of the wafer of the solar cell, the method further comprising:
subsequent to electrically contacting the metal foil to the metalized surface of the wafer, cutting to the metal foil to provide the metal foil having a surface area substantially the same as the surface area of the wafer of the solar cell.

7. The method of claim 1, further comprising:
prior to placing the metal foil over the metalized surface of the wafer of the solar cell, cutting a large sheet of foil to provide the metal foil having a surface area substantially the same as a surface area of the wafer of the solar cell.

8. The method of claim 1, wherein placing the metal foil over the metalized surface of the wafer of the solar cell comprises adhering the metal foil to the metalized surface of the wafer of the solar cell by vacuum suction prior to placing the protection layer over the metal foil.

9. The method of claim 1, wherein locating the metal foil with the metalized surface of the wafer comprises applying pressure by using an applicator selected from the group consisting of a roller, a diamond-shaped applicator, and a squeegee.

10. The method of claims 9, wherein applying pressure by using the applicator comprises removing air and physical gaps from between the metal foil and the metalized surface of the wafer.

11. The method of claim 1, wherein the metal foil has one or more holes there through, the one or more holes for enabling vacuum adhesion of the protection layer to the metal foil during the placing the protection layer over the metal foil.

12. The method of claim 1, wherein the metalized surface of the wafer of the solar cell comprises alternating N-type and P-type semiconductor regions and a plurality of metal seed material regions on each of the alternating N-type and P-type semiconductor regions, and wherein locating the metal foil comprises contacting the metal foil to the plurality of metal seed material regions.

13. A method of fabricating a solar cell, the method comprising:
placing an aluminum foil over a metalized surface of a wafer of the solar cell, the metalized surface of the wafer of the solar cell comprises alternating N-type and P-type semiconductor regions and a plurality of aluminum seed regions on each of the alternating N-type and P-type semiconductor regions;
placing a protection layer over the aluminum foil;
locating the aluminum foil with the metalized surface of the wafer, wherein the protection layer preserves an optically consistent surface of the aluminum foil during the locating, and wherein locating the aluminum foil comprises contacting the aluminum foil to the plurality of aluminum seed regions;
subsequent to the locating, electrically contacting the aluminum foil to the metalized surface of the wafer; and
subsequent to electrically contacting the aluminum foil to the metalized surface of the wafer, removing the protection layer from the aluminum foil.

14. The method of claim 13, wherein electrically contacting the aluminum foil to the metalized surface of the wafer comprises laser welding through the protection layer.

15. The method of claim 14, wherein the protection layer is substantially transparent to a laser used for the laser welding.

16. The method of claim 13, wherein preserving the optically consistent surface of the aluminum foil during the locating comprises slightly deforming the aluminum foil, but not streaking, stretching or scuffing the aluminum foil.

17. The method of claim 13, wherein preserving the optically consistent surface of the aluminum foil during the locating comprises forming essentially no deformation in the aluminum foil.

18. The method of claim 13, further comprising:
prior to placing the aluminum foil over the metalized surface of the wafer of the solar cell, cutting a large sheet of foil to provide the aluminum foil having a surface area substantially the same as a surface area of the wafer of the solar cell.

19. The method of claim 13, wherein locating the aluminum foil with the metalized surface of the wafer comprises applying pressure by using an applicator selected from the group consisting of a roller, a diamond-shaped applicator, and a squeegee.

20. The method of claims 19, wherein applying pressure by using the applicator comprises removing air and physical gaps from between the aluminum foil and the metalized surface of the wafer.

* * * * *